United States Patent [19]

Furukawa

[11] Patent Number: 5,045,743

[45] Date of Patent: Sep. 3, 1991

[54] SURFACE ACOUSTIC WAVE DEVICE

[75] Inventor: Katsuo Furukawa, Tokyo, Japan

[73] Assignee: Clarion Co., Ltd., Tokyo, Japan

[21] Appl. No.: 469,931

[22] Filed: Jan. 25, 1990

[30] Foreign Application Priority Data

Jan. 27, 1989 [JP] Japan .................................. 1-18093

[51] Int. Cl.⁵ .............................................. H01L 41/08
[52] U.S. Cl. .................................. 310/313 D; 364/821
[58] Field of Search ..................... 310/313 D; 364/821

[56] References Cited

U.S. PATENT DOCUMENTS

| 3,896,401 | 7/1975 | Yano | 310/318 |
| 4,223,185 | 9/1980 | Picou | 364/726 |
| 4,990,814 | 2/1991 | Tanski et al. | 310/313 D |

FOREIGN PATENT DOCUMENTS

| 0093415 | 7/1981 | Japan | 333/195 |
| 0283310 | 11/1988 | Japan | 333/195 |

Primary Examiner—Mark O. Budd
Assistant Examiner—Thomas M. Dougherty
Attorney, Agent, or Firm—Wallenstein, Wagner & Hattis, Ltd.

[57] ABSTRACT

A surface acoustic wave device including a surface acoustic wave convolver element, provided with two input transducers disposed on a piezoelectric substrate and a rectangular output gate disposed between the two input transducers, is disclosed, in which it comprises further a binary tree connected with the output gate and a matching circuit connected with the binary tree stated above, which is a Tchebycheff type impedance transforming circuit.

4 Claims, 5 Drawing Sheets

SURFACE ACOUSTIC WAVE DEVICE

FIELD OF THE INVENTION

The present invention relates to a surface acoustic wave (hereinbelow abbreviated to SAW) device including an SAW convolver element.

BACKGROUND OF THE INVENTION

There are known following sorts of prior art SAW convolvers, classified according to the structure thereof. The separating medium structure is a structure, in which a slight air gap is put between a semiconductor layer and a piezoelectric layer. By this structure the advantages of each of the semiconductor layer and the piezoelectric layer can be utilized and it has excellent characteristics. However it can be difficult to produce because of the requirement to form the air gap of an order of 100 nm.

By the elastic structure, although the electrode pattern can be easily formed on a piezoelectric substrate, since the elastic non-linearity of the piezoelectric body is utilized, the efficiency thereof as a convolver is not so high.

By the layered structure a piezoelectric layer is formed on a semiconductor substrate and the electrode pattern is constructed further thereon. Since this structure utilizes non-linear characteristics of the capacity of the depletion layer in the semiconductor body, it has an advantage that the efficiency thereof as a convolver is high.

FIG. 4 is a cross-sectional view of a convolver having this layered structure and FIG. 5 is a plan view thereof, in which reference numerals 1 and 2 are input terminals; 3 and 4 are input matching circuits; 5, 5′, 6 and 6′ are input transducer terminals; 7 and 8 are input transducers; 9 is an output gate; 10 is an output gate terminal group; 11 is a binary tree input terminal group; 12 is a binary tree; 13 is a binary tree output terminal; 14 is an output matching circuit; 15 is a convolver output terminal; 16 is a bonding wire; 17 is a piezoelectric layer (ZnO, etc.); 18 is a semiconductor layer (silicon, etc.); and 19 is an insulating layer (SiO, etc.). The semiconductor layer is made usually of silicon and the piezoelectric layer 17 is made of zinc oxide. The input transducers 7 and 8 as well as the output gate 9 are metallic films made of aluminum, etc. Discussion of one such prior art convolver employing a binary tree is to be found in an article entitled "Small-Aperture Focusing Chirp Transducers vs. Defraction-Compensated Beam Compressors in Elastic SAW Convolvers (IEEE Transactions on Sonics and Ultrasonics, Volume SU-32, No. 5, Sept. 1985, pp. 675-676).

In order to increase the process gain indicating the performance of the convolver, it is required to increase the product B·T of the bandwidth (MHz) and the delay time T (sec) due to the output gate 9 (the length of the longer side of the output gate being denoted by l, T=l/v, where v represents the speed of the surface acoustic wave and the frequency bandwidth B is supposed to be 3dB). In order to enlarge the bandwidth B, it may be sufficient to design the input transducer so as to have a wide band. Further the convolution output is generated by the output gate 9 and in order to elongate the delay time T, it is sufficient to increase the longer side l of the gate.

Now transmission characteristics indicating the characteristics of the propagating portion between the input transducer 7 and the input transducer 8 will be explained.

The transmission characteristics are indicated in FIG. 6. This is a so-called band pass filter and it can be understood from the figure that a signal frequency region. This comes from the layered structure indicated in FIG. 4 due to the fact that the propagation speed of the SAW varies depending on the thickness of the piezoelectric layer and the propagation frequency. This is unavoidable characteristics so far as normal type transducers are used, unless special transducers are designed.

On the output gate of a convolver having the layered structure indicating these high frequency attenuation characteristics an output signal having a frequency twice as high as that of an input signal is generated and the frequency characteristics of the output signal appear also in the convolver output characteristics as indicated in FIG. 7. The ordinate in FIG. 7 represents $F_T$(dBm), which is the output in the case where an electric power 0 dBm is inputted through each of the input terminals. Further, this figure shows a state ideally matched with 50 Ω for every frequency of the output signal. Consequently the greatest value of $F_T$, which can be outputted, can be known. FIG. 3 is traced also under the same conditions.

In practice, the input portion and the output portion of a convolver should be necessarily matched by means of matching circuits. The working frequency band B (MHz) required for the convolver is determined by the design of the input transducers. However the working band is reduced by this addition of the matching circuits. Further, when the gate length l is increased in order to increase the delay time T, ΔL indicated in FIG. 6 is increased. Consequently $\Delta F_T$ is also increased and as the result the working band is reduced.

OBJECT OF THE INVENTION

Taking the problematical points described above into account, the object of the present invention is to provide an SAW device including an SAW convolver element having an output matching circuit capable of making the best of the designed frequency bandwidth as it is, while keeping the output at the highest level.

SUMMARY OF THE INVENTION

In order to achieve the above object, an SAW device including an SAW convolver element according to the present invention, provided with two input transducers disposed on a piezoelectric substrate and a rectangular output gate disposed between the two input transducers, is characterized in that it comprises further a binary tree connected with the output gate and a matching circuit connected with the binary tree stated above, which is a Tchebycheff type impedance transforming circuit.

Since the amount of mismatching of the matching circuit is determined in accordance with the upper frequency limit of the designed frequency band of the input transducers, the designed frequency band is the working band, as it is. Further, since the amount of mismatching of the output matching circuit is set so as to be smallest, the output level is kept at the highest level.

Since the Tchebycheff type impedance transforming circuit is a low pass filter, it is possible to cut-off unnecessary signals in the high frequency region induced in the rectangular gate electrode and the binary tree or coupled therewith. Therefore it is possible to suppress through in the high frequency region between the input and the output.

DETAILED DESCRIPTION

Figure 1:
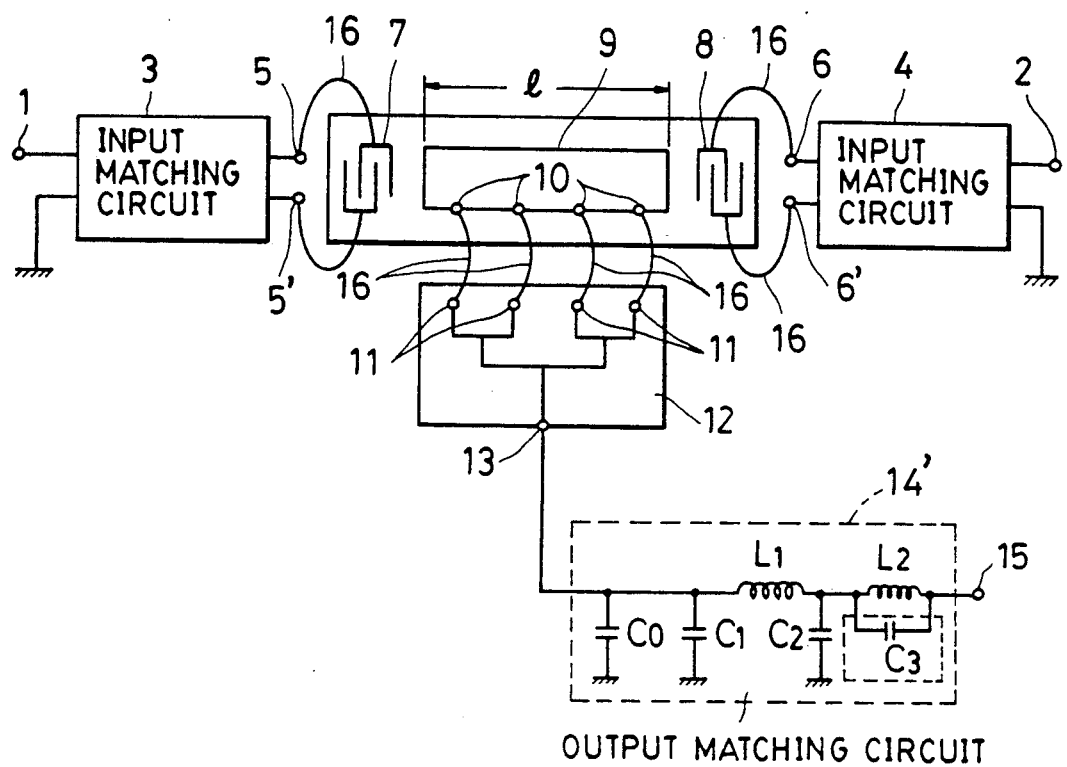
FIG. 1 is a scheme illustrating an embodiment of the convolver having an output matching circuit according to the present invention.
Figure 5:
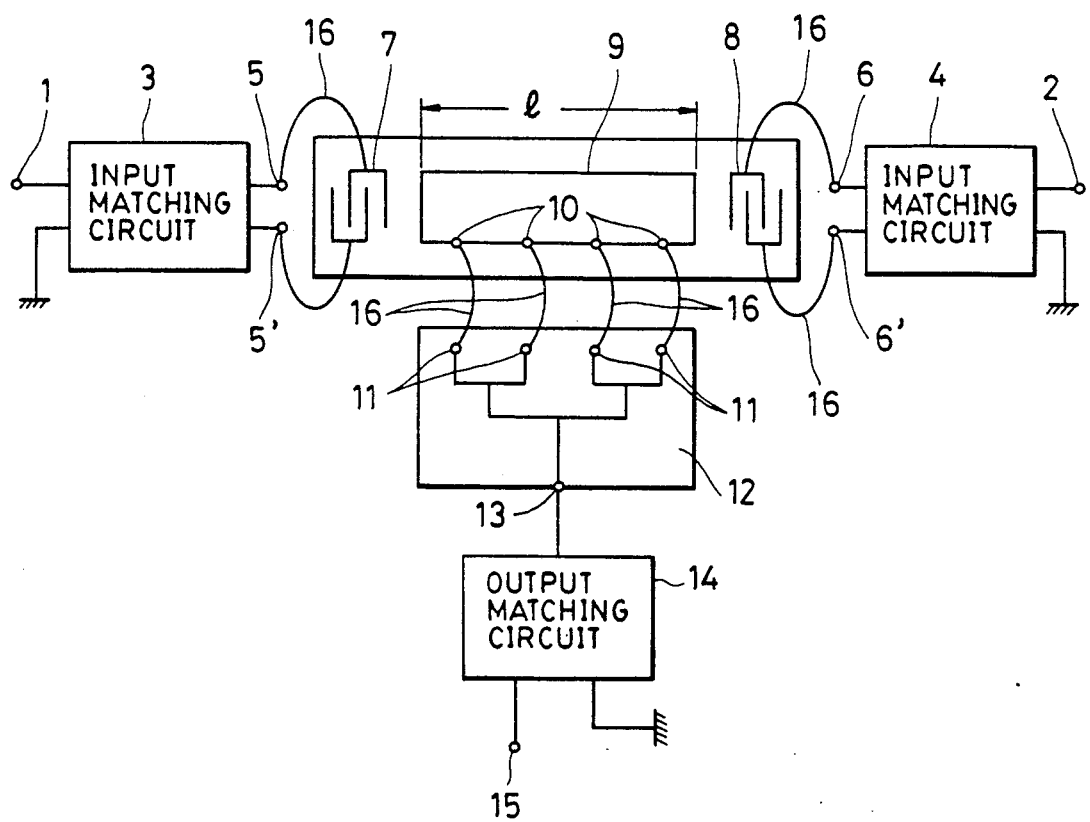
Figure 6:
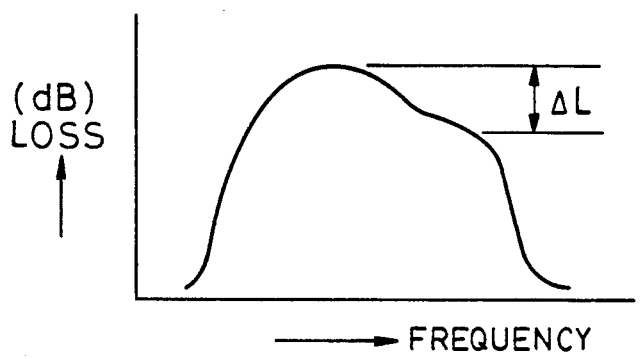
FIG. 6 is a graph indicating transmission characteristics.
Figure 7:
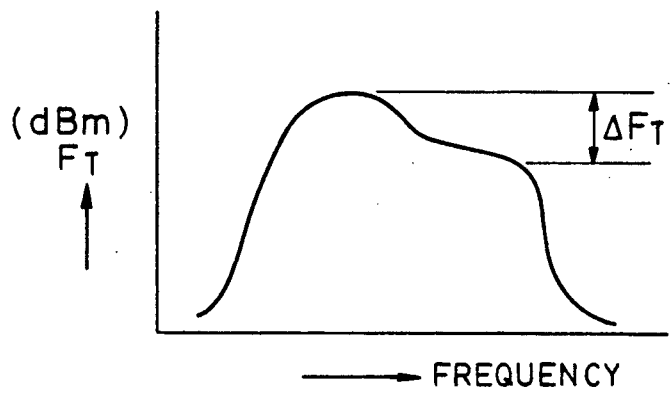
FIG. 7 is a graph indicating convolver output characteristics.

FIG. 1 is a scheme illustrating a convolver including the output matching circuit 14' according to the present invention, in which the reference numerals identical to those used in FIG. 5 represent identical or similar circuits and the output matching circuit 14' is a Tchebycheff type filter consisting of two stages, $C_3$ representing a regulating capacitor. Further it is supposed that the gate side of the output matching circuit 14' has an impedance including a binary tree 12.

Figure 2:
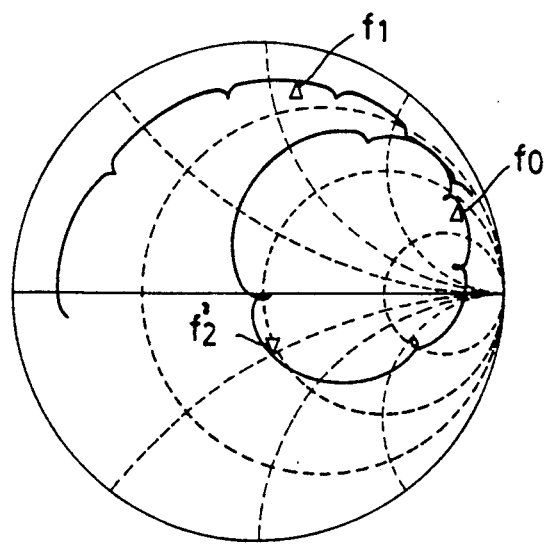
FIG. 2 is an impedance chart when the convolver is regulated so as to be at the highest level by means of the output matching circuit indicated in FIG. 1.

FIG. 2 is an impedance chart, when the output signal of the convolver has a wide band (designed band) and it is regulated so as to be at the highest level by means of the output regulating circuit. In the figure $f_1$ and $f'_2$ represent the working frequency band.

Figure 3:
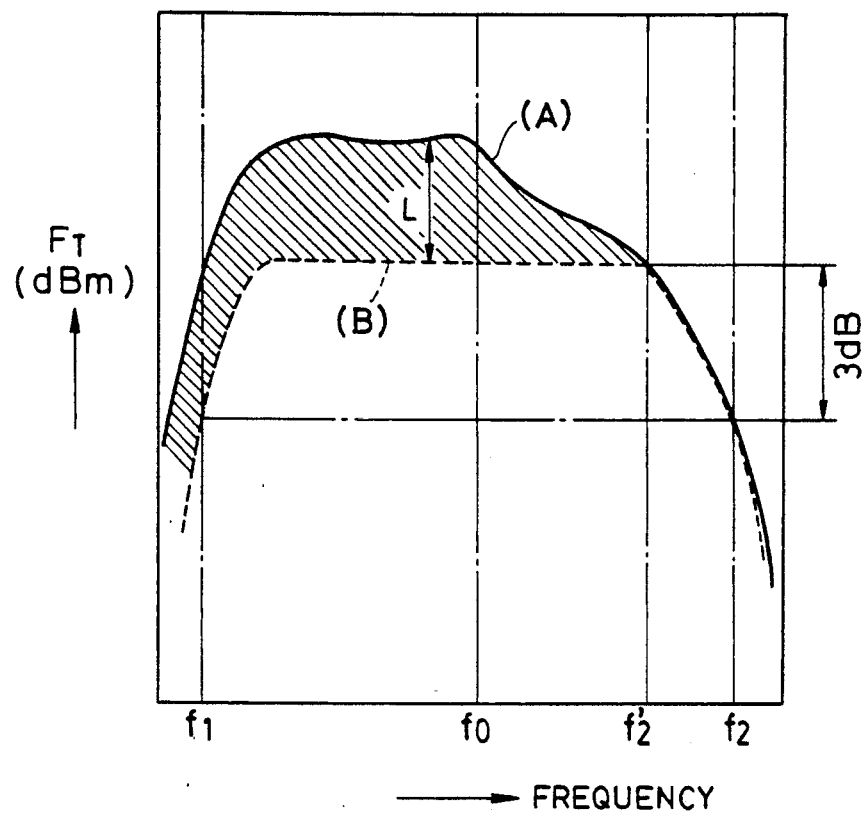
FIG. 3 is a graph showing frequency characteristics of the output signal.
Figure 4:
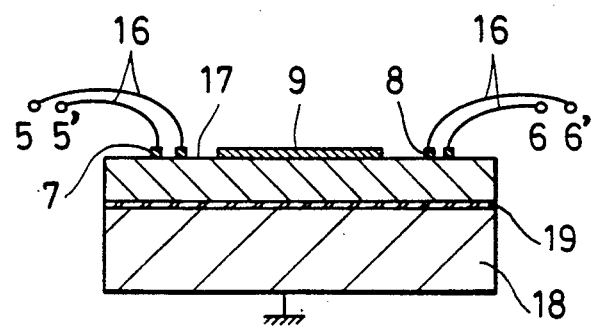
FIGS. 4 and 5 are a cross-sectional view and a plan view, respectively, of an SAW convolver having a layered structure.

FIG. 3 is a graph showing frequency characteristics of the original output signal on the output gate, including no mismatch loss due to the output matching circuit. Consequently it indicates the state ideally matched with 50 Ω for every frequency of the output signal, in which the level indicates the value as high as possible of the output signal.

Now the operation of the embodiment described above will be explained.

The graph indicated in FIG. 3 shows schematically frequency characteristics of the output signal generated in the output gate. In the figure, the curve indicated by (A) includes no amount of mismatching of the output matching circuit, which indicates the greatest value, which the output signal can have. In the curve indicated by (A), the amount of mismatching at the frequency $f'_2$, where the level is higher by 3dB than the level at $f_2$ (upper limit of the designed band), is set to be zero. With reference to the level, which is higher by 3dB, the part exceeding it is considered to be the amount of mismatching (hatched portion), which part is cut-off by the output matching circuit. The curve indicated by (B) represents this cut-off state. Consequently it is obvious that L (hatch portion) represents the minimum amount to be cut-off.

In this way, the level of the frequency characteristics of the output, which has passed through the circuit matching the output of the gate, is the highest level including the minimum attenuation and in addition the frequency characteristics satisfy the required frequency band.

Figure 8:
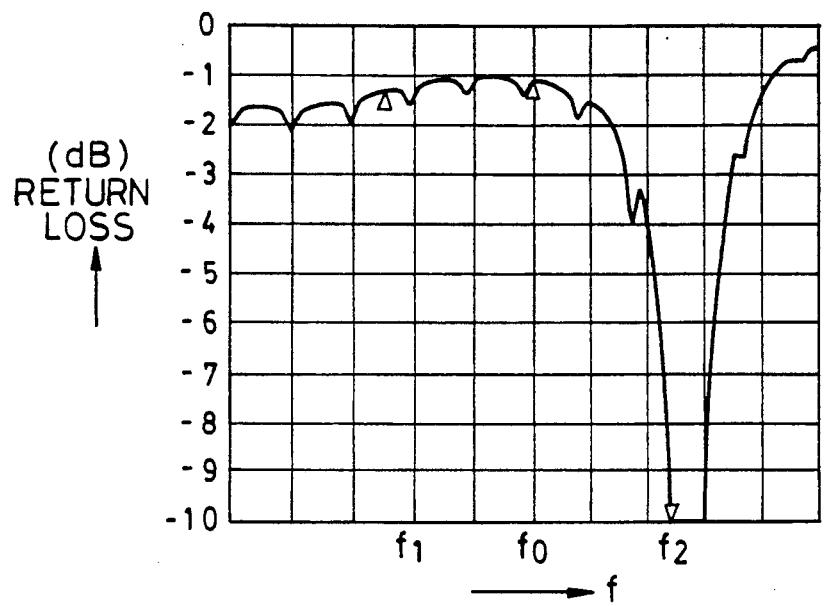
FIG. 8 is a graph indicating return loss characteristics.

Consequently the mismatch frequency characteristics due to the output matching circuit itself can be easily obtained from FIG. 3. The return loss characteristics can be obtained from the relation between the amount of mismatching and the reflecting characteristics of the impedance, and they are shown in FIG. 8.

Now a practical output matching circuit will be obtained.

A matching circuit, for which a Tchebycheff type impedance transforming circuit is applied, is examined.

The impedance (impedance, when the gate side is seen from the binary output terminal 13) including the output gate 9 and the binary tree 12 consisting of a plurality of pairs of two strip lines connected in parallel indicated in FIG. 5 is represented by $Z_g = r + jx$. Then it is necessary to compensate the jx component by a parallel capacitance $C_0$, taking the Tchebycheff type impedance transforming circuit connected in the succeeding stage into account. Consequently the matching circuit is constructed as indicated in FIG. 1.

Here it is supposed that the characteristics of the binary tree is included by the gate 9. The reactance of the gate is compensated by the parallel capacitance $C_0$ so that the impedance is represented by a real number.

The Tchebycheff type impedance transforming circuit is of low pass filter type and consists of two stages including 2 inductances and 2 capacitors under the conditions of the bandwidth and the loss.

The device is regulated so as to have the return characteristics indicated in FIG. 8 by means of the matching circuit indicated in FIG. 1. The impedance chart obtained at this time is shown in FIG. 2.

Figure 9:
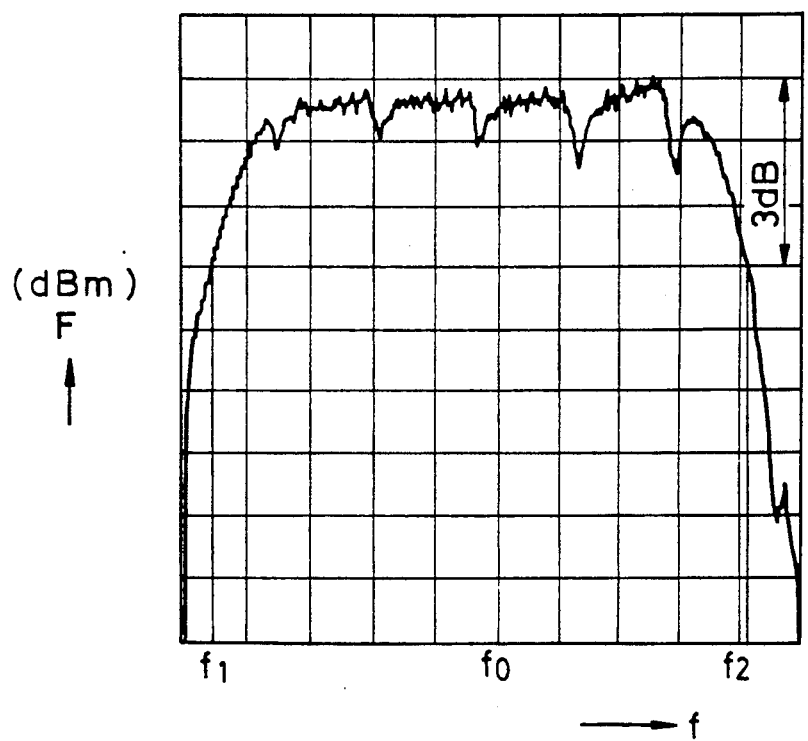
FIG. 9 is a graph indicating output characteristics.

The output characteristics obtained in practice are shown in FIG. 9. It is understood that the necessary band can be obtained in this way with the mismatch loss as small as possible.

Further, by using this matching circuit, a wide band matching can be effected only by regulating $C_2$ in FIG. 1 even for flat characteristics, in which no attenuation is found in the high frequency region in FIG. 3. In addition, since this matching circuit is a low pass filter, unnecessary signals over the cut-off frequency are attenuated. For example, the unnecessary signals induced in the binary tree or the binary tree or coupled therewith are suppressed.

As explained above, according to the present invention, it is possible to make the best of the designed frequency bandwidth as it is, while keeping the output at the highest level. Representative values for a convolver of a 20 m/m type: $C_0 = 11$ pF; $C_1 = 30$ pF; $C_2 = 6$ pF; $C_3 = 0.9$ pF; $L_1 = 24.6$ nH; and $L_2 = 25$ nH.

While particular embodiments of the invention have been shown and described, it will be obvious to those skilled in the art that various changes and modifications may be made without departing from the present invention in its broader aspect.

What is claimed is:

1. A surface acoustic wave convolver element comprising:
    two input transistors disposed on a piezoelectric substrate;
    a rectangular output gate disposed between said two input transducers, said gate including a plurality of gate output terminals;

a binary tree structure having a plurality of tree input terminals connected to said gate output terminals and having a tree output terminal; and a matching circuit connected between said binary tree output terminal and a matching circuit output terminal, said matching circuit being a Tchebycheff type impedance transforming circuit.

2. A surface acoustic wave according to claim 1 wherein said Tchebycheff type impedance convolver element transforming circuit comprises a first parallel capacitor connected between said tree output terminal and ground, a first series inductor connected between said tree output terminal and a node, a second parallel capacitor connected between said node and ground, and a series inductor connected between said node and said matching circuit output terminal.

3. A surface acoustic wave convolver element comprising:

two input transistors disposed on a piezoelectric substrate;

an output gate disposed between said two input transducers, said gate including a plurality of gate output terminals;

a binary tree structure having a plurality of tree input terminals connected to said gate output terminals and having a tree output terminal; and a matching circuit connected between said binary tree output terminal and a matching circuit output terminal, said matching circuit being a Tchebycheff type impedance transforming circuit.

4. A surface acoustic wave according to claim 3 wherein said Tchebycheff type impedance convolver element transforming circuit comprises first parallel capacitor connected between said tree output terminal and ground, a first series inductor connected between said tree output terminal and a node, a second parallel capacitor connected between said node and ground, and a series inductor connected between said node and said matching circuit output terminal.

* * * * *